(12) United States Patent
Cha (10) Patent No.: US 6,649,953 B2
(45) Date of Patent: Nov. 18, 2003

(54) MAGNETIC RANDOM ACCESS MEMORY HAVING A TRANSISTOR OF VERTICAL STRUCTURE WITH WRITING LINE FORMED ON AN UPPER PORTION OF THE MAGNETIC TUNNEL JUNCTION CELL

(75) Inventor: Seon Yong Cha, Kyoungki-do (KR)

(73) Assignee: Hynix Semiconductor Inc, Kyoungki-do (KR)

(*) Notice: Subject to any disclaimer, the term of this patent is extended or adjusted under 35 U.S.C. 154(b) by 0 days.

(21) Appl. No.: 10/105,173

(22) Filed: Mar. 25, 2002

(65) Prior Publication Data

US 2002/0140016 A1 Oct. 3, 2002

(30) Foreign Application Priority Data

Mar. 28, 2001 (KR) .......................... 2001-16309

(51) Int. Cl.[7] .................. H01L 31/119; G11C 7/02; G11C 8/00
(52) U.S. Cl. .................. 257/295; 365/209; 365/225.5; 365/243.5
(58) Field of Search ............................ 257/295; 438/3; 365/225.5, 209, 243.5, 55, 74, 50

(56) References Cited

U.S. PATENT DOCUMENTS 6,379,978 B2 * 4/2002 Goebel et al. .................. 438/3
6,473,336 B1 * 10/2002 Nakajima et al. ............ 365/171

* cited by examiner

Primary Examiner—David Nelms
Assistant Examiner—Long Tran
(74) Attorney, Agent, or Firm—Marshall, Gerstein & Borun LLP (57) ABSTRACT

A magnetic random access memory (MRAM) having a vertical structure transistor has the characteristics of faster access time than SRAM, high density as with DRAM, and non-volatility like a flash memory device. The MRAM has a vertical structure transistor, a first word line including the transistor, a contact line connected to the transistor, a magnetic tunnel junction (MTJ) cell deposited on the contact line, a bit line deposited on the MTJ cell, and a second word line deposited on the bit line at the position of MTJ cell. With the disclosed structure, it is possible to improve the integration density of a semiconductor device, to increase the short channel effect, and to improve the control rate of the resistance, while using a simplified manufacturing process.

10 Claims, 6 Drawing Sheets

MAGNETIC RANDOM ACCESS MEMORY HAVING A TRANSISTOR OF VERTICAL STRUCTURE WITH WRITING LINE FORMED ON AN UPPER PORTION OF THE MAGNETIC TUNNEL JUNCTION CELL

FIELD OF THE INVENTION

The present invention relates to a magnetic random access memory (hereinafter MRAM) having a vertical structure transistor and, more particularly, to a MRAM having a faster access time than SRAM, a high density like that of DRAM, and a non-volatility like a flash memory device.

BACKGROUND OF THE INVENTION

As one of the next generation memory devices, MRAMs using a ferromagnetic material have been proposed by some semiconductor memory manufacturing companies. The MRAM is a memory device for reading and writing information that relies upon forming multi-layer ferromagnetic thin films and sensing current variations that depend upon the magnetization direction of the respective thin films. The MRAM device offers a high speed and low power consumption, and it allows for high integration density because of the special properties of the magnetic thin film. It also performs a nonvolatile memory operation, like a flash memory device.

Memory storage in a MRAM is achieved by using a giant magneto-resistive (abbreviated as 'GMR') phenomenon or a spin-polarized magneto-transmission (SPMT) in which spin influences electron transmission. GMR devices rely upon the variation in resistance that occurs when spin directions for two magnetic layers, having a non-magnetic layer therebetween, are different.

The SPMT technique utilizes the phenomenon that larger currents are transmitted when spin directions are identical in two magnetic layers, having an insulating layer therebetween. This is used to create a magnetic permeable junction memory device.

Despite these techniques, the MRAM research is still in its early stages, and mostly concentrated on the formation of multi-layer magnetic thin films. Little research is performed on unit cell structure or the peripheral sensing circuit.

Figure 1:
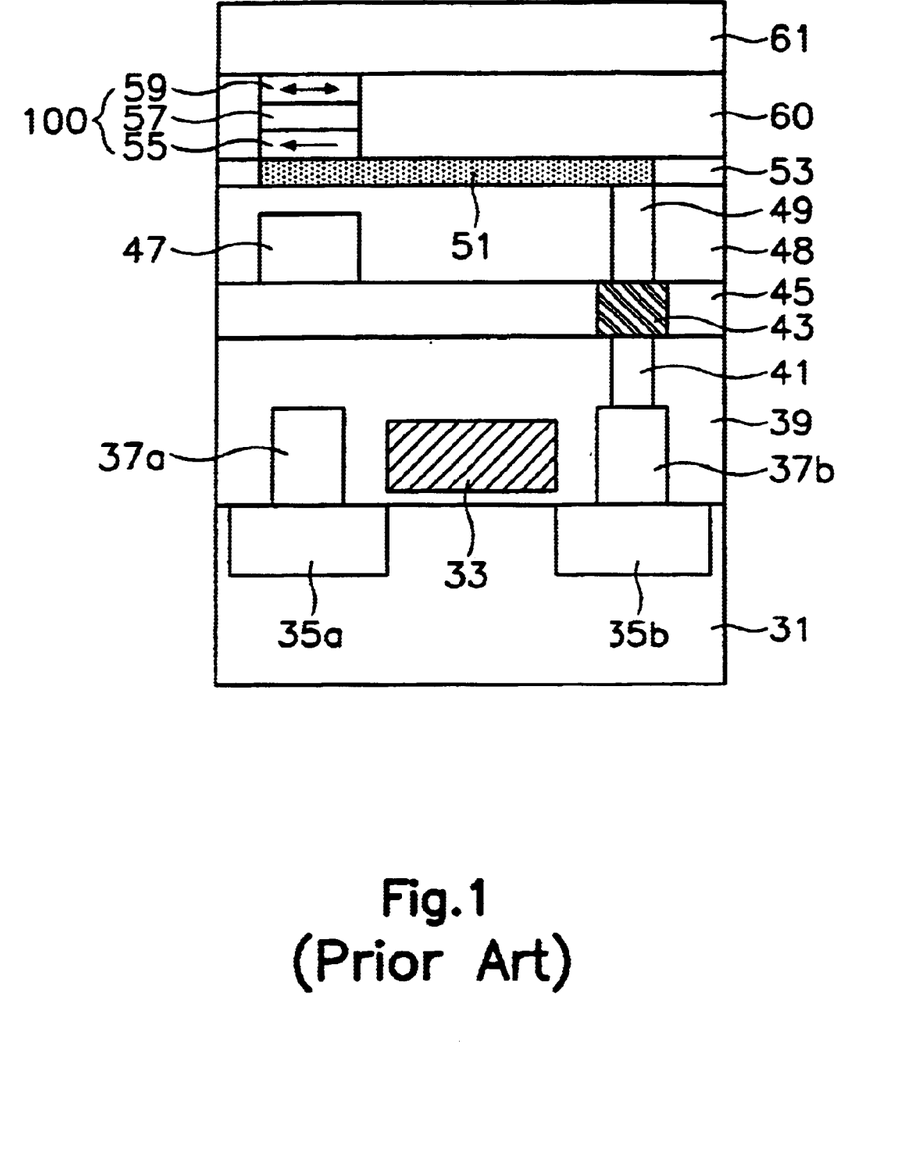
FIG. 1 is a cross-sectional view illustrating a conventional MRAM.

FIG. 1 is a cross-sectional diagram illustrating a conventional MRAM. Shown is a gate electrode 33, i.e., a first word line, that has been formed on a semiconductor substrate 31. Source/drain junction regions 35a and 35b are formed on the semiconductor substrate 31 on both sides of the first word line 33, respectively. A ground line 37a and a first conductive layer 37b are formed to contact the source/drain junction regions 35a and 35b, respectively. Here, the ground line 37a is formed during the patterning process that forms the first conductive layer 37b. Thereafter, a first interlayer insulating film 39 is formed to planarize the whole surface of the resultant structure, and a first contact plug 41 is formed to contact the first conductive layer 37b, through the first interlayer insulating film 39.

A second conductive layer, which is a lower read layer 43 contacting the first contact plug 41, is patterned. A second interlayer insulating film 45 is formed to planarize the whole surface of the resultant structure, and a second word line, which is a write line 47, is formed on the second interlayer insulating film 45. A third interlayer insulating film 48 is formed to planarize the upper portion of the second word line 47.

A second contact plug 49 is formed to contact the second conductive layer 43. A seed layer 51 is formed to contact the second contact plug 49. Here, the seed layer 51 is formed to overlap between the upper portion of the second contact plug 49 and the upper portion of the write line 47. Then, a fourth interlayer insulation layer 53 is formed and planarized to expose the seed layer 51. Thereafter, a semi-ferromagnetic layer (not shown), a pinned ferromagnetic layer 55, a tunnel junction layer 57, and a free ferromagnetic layer 59 are stacked on the seed layer 51, thereby forming a magnetic tunnel junction (MTJ) cell 100 having a pattern size as large as the write line 47 and overlapping the write line 47 in location.

At this time, the semi-ferromagnetic layer prevents the magnetization direction of the pinned layer 55 from changing, and the magnetization direction of the tunnel junction layer 57 is fixed to one direction. The magnetization direction of the free ferromagnetic layer 59 can be changed by application of an external magnetic field, and a '0' or '1' bit can be stored by the device according to the magnetization direction of the free ferromagnetic layer 59. A fifth interlayer insulation layer 60 is formed on the whole surface and planarized to expose the free ferromagnetic layer 59, and an upper read layer, i.e., bit line 61 connected to free ferromagnetic layer 59 is formed.

In operation, the unit cell of the MRAM includes one field effect transistor formed of the first word line 33, which is a read line used to read information, the MTJ cell 100, and the second word line 47. The second word line 47 is a write line that determines the magnetization direction of the MTJ cell 100 by applying a current to form an external magnetic field. The field effect transistor also includes the bit line 61, which is an upper read layer for determining the magnetization direction of the free ferromagnetic layer 59 by applying a current to the MTJ cell 100 that flows in a vertical direction.

To read the information from the MTJ cell 100, a voltage is applied to the first word line 33, as the read line. This turns the field effect transistor on, and, by sensing the magnitude of the current applied to the bit line 61, the magnetization direction of the free ferromagnetic layer 59 in the MTJ cell 100 is detected and its state read.

During storage of information in the MTJ cell 100, the field effect transistor is in an off state and the magnetization direction in the free ferromagnetic layer 59 is controlled by a magnetic field generated by applying current to the second word line 47, which is the write line, and to the bit line 61. When current is applied to the bit line 61 and the write line 47 at the same time, the generated magnetic field is strongest at a vertical intersecting point of the two metal lines. This may be used to select one cell from a plurality of cells, for example.

The operation of the MTJ cell 100 in the MRAM will now be described. When the current flows in the MTJ cell 100 in a vertical direction, a tunneling current flows through an interlayer insulating film. When the tunnel junction layer 57 and the free ferromagnetic layer 59 have the same magnetization direction, this tunneling current increases. When the tunnel junction layer 57 and the free ferromagnetic layer 59 have different magnetization directions, however, the tunneling current decreases due to a tunneling magneto resistance (TMR) effect. A decrease in the magnitude of the tunneling current due to the TMR effect is sensed, and, thus, the magnetization direction of the free ferromagnetic layer 59 is sensed, which thereby detects the information stored in the MTJ cell 100.

As described above, the conventional MRAM comprises a horizontal structure transistor having the write line as the second word line and the MTJ cell in a vertical stack on an upper portion of the transistor. In order to form the MRAM, surface roughness in the lower part of the device, where the MTJ cell is formed, should be controlled within nanometer tolerances. However, since there is a second word line and contact lines below the MTJ cell it is difficult to prevent surface roughness on the lower part of the device to within nanometer ranges.

Since the structure of a MRAM device is more complex than that of DRAM, as a whole, the MRAM requires a total of four metal lines per unit cell, i.e., two word lines, one bit line, and a ground line. MRAMs using the MTJ cell could potentially offer high integration, i.e., integration on the order of several to 100 gigabits To achieve this, increasing a short channel effect of a transistor and control of resistance are important factors. However, the resistance is more difficult to control as the size of the transistor becomes smaller, and the resistance of the transistor together with that of the MTJ cell has a great influence on cell operations.

SUMMARY OF THE INVENTION

According to an embodiment, a magnetic random access memory comprises a vertical structure transistor; a read line connected to a gate electrode formed at a sidewall of the vertical structure transistor; a magnetic tunnel junction cell formed on a drain junction region existing over an upper portion of the vertical structure transistor; and a write line formed on an upper portion of the magnetic tunnel junction cell.

The MRAM also comprises a vertical structure transistor; a first word line connected to a gate electrode of the vertical structure transistor; a contact line connected to the vertical structure transistor; a MTJ cell formed on the contact line; a bit line formed on the MTJ cell; and a second word line formed on the bit line over an upper portion of MTJ cell. Another embodiment provides a method for forming the MRAM comprises the steps of: etching a semiconductor substrate by photolithography using an active mask to form a circular pillar; forming a gate oxide layer at sidewalls of the circular pillar; performing ion implantation of a high concentration impurity on the substrate and on a top portion of the circular pillar by a drive-in process, thereby forming a drain junction region on the upper side of the circular pillar and a source junction region on the bottom of the circular pillar extending into the substrate surface; forming a first word line of a gate electrode by forming a planarized conductor layer for the gate electrode exposing the drain junction region and then patterning the planarized conductor layer; forming a planarized first interlayer insulation layer; forming a contact line contacting the drain junction region through the first interlayer insulation layer; forming a semi-magnetic layer, a pinned ferromagnetic layer, a tunnel junction layer, and a free ferromagnetic layer above the contact line; forming a magnetic tunnel junction cell by patterning the semi-magnetic layer, the pinned ferromagnetic layer, the tunnel junction layer, and the free ferromagnetic layer by photolithography using a magnetic tunnel junction cell mask; forming a planarized second interlayer insulation layer exposing the magnetic tunnel junction cell; forming a bit line contacting the free ferromagnetic layer; and forming a second word line over the magnetic tunnel junction cell and above the bit line.

Yet, another embodiment provides method for forming the MRAM comprising the steps of: etching a semiconductor substrate by photolithography using an active mask, thereby forming a circular pillar extending above the substrate; forming a gate oxide layer on the substrate; performing an ion implantation of a high concentration impurity and drive-in processes, thereby forming a drain junction region on an upper portion of the circular pillar and a source junction region on a bottom portion of the circular pillar and on the substrate; forming a conductor layer for a gate electrode at a predetermined thickness on the substrate, and performing an anisotropic etching process, thereby forming a gate electrode in the form of a conductor spacer at a sidewall of the circular pillar; forming a planarized first interlayer insulation layer; forming a contact line contacting the drain junction region through the first interlayer insulation layer; forming a semi-magnetic layer, a pinned ferromagnetic layer, a tunnel junction layer, and a free ferromagnetic layer above the contact line; forming the magnetic tunnel junction cell by pattering the semi-magnetic layer, the pinned ferromagnetic layer, the tunnel junction layer, and the free ferromagnetic layer by photolithography using a magnetic tunnel junction cell mask; forming a planarized second interlayer insulator exposing the magnetic tunnel junction cell; forming a bit line contacting the free ferromagnetic layer; and forming a second word line over an upper portion of the magnetic tunnel junction cell and above the bit line.

BRIEF DESCRIPTION OF THE DRAWINGS

The present invention will be more clearly understood from the following description with reference to the accompanying drawings, wherein.

DESCRIPTION OF THE PREFERRED EMBODIMENT

Figure 2A:
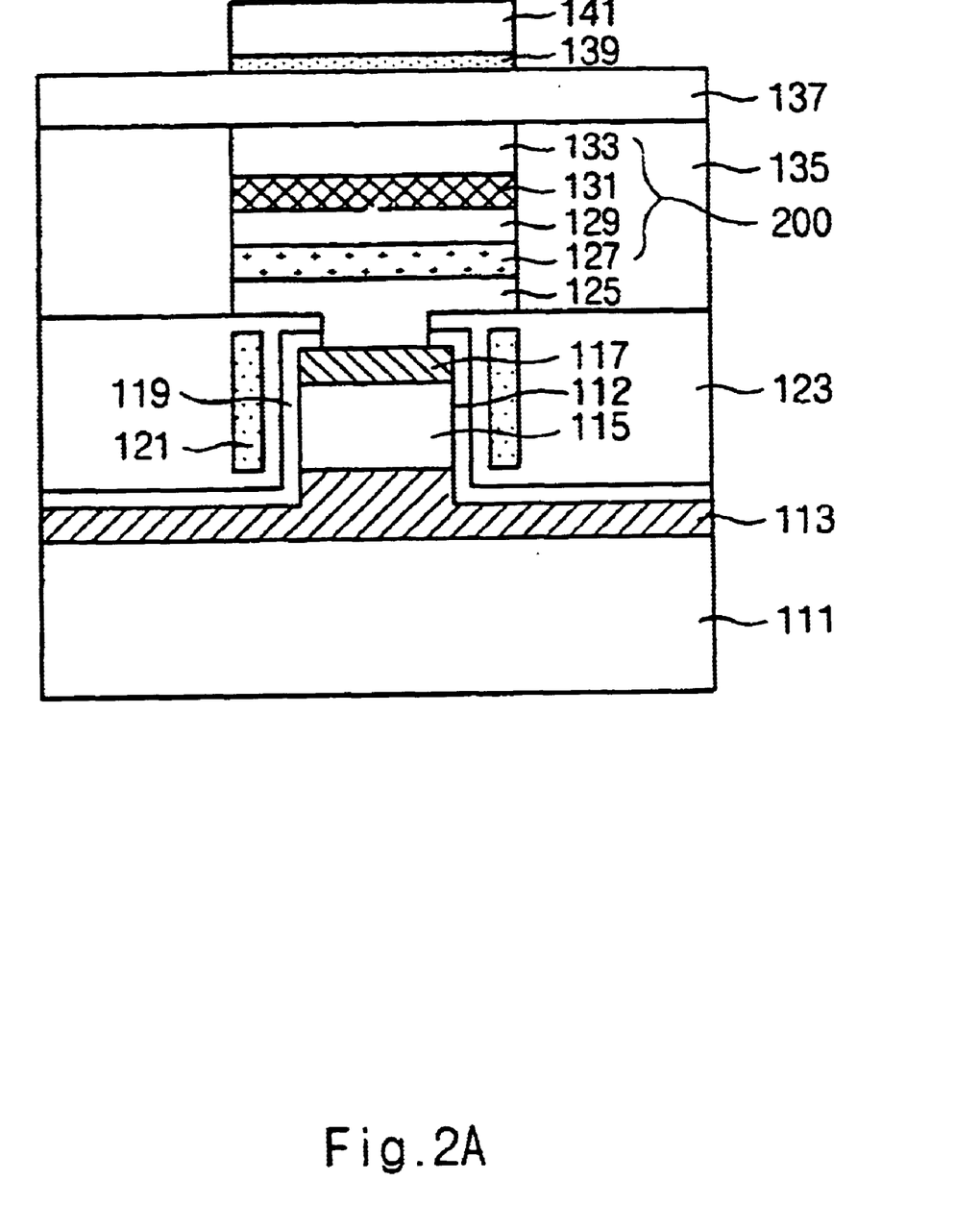
FIGS. 2A to 2C show a unit cell of a MRAM having a vertical structure transistor.

Exemplary embodiments are shown in FIGS. 2A–5. FIGS. 2A, 2B, and 2C illustrate a cross-sectional view, a circuit diagram, and a planar top view, respectively, of a MRAM having a vertical structure transistor, in accordance with an embodiment.

Referring to FIG. 2A, the MRAM has a vertical structure transistor that includes a source junction region 113 formed over a semiconductor substrate 111 that includes a circular pillar 115. The vertical structure transistor further includes a drain junction region 117 formed in the circular pillar 115 and positioned at the center of the source junction region 113. A gate oxide layer 119 is formed above the surface of the substrate 111 at the outer surface of the sidewall of the circular pillar 115, and a gate electrode 121 is formed at the outer side surface of the gate oxide layer 119. As shown in FIG. 2C, the gate oxide layer 119 and gate electrode 121 are preferably formed around the entire circular pillar 115.

The vertical structure transistor of the MRAM also includes a stacked structure formed of a contact line 125 contacting the drain junction region 117 and a MTJ cell 200. A bit line 137 contacts the MTJ cell 200, and a write line 141, which functions as a second word line, is positioned above the bit line 137 and over the MTJ cell 200.

The MTJ cell 200 extends over the gate electrode 121 formed on the sidewall of the circular pillar 115. Further, as shown in FIG. 2C, the planar dimensions (i.e., as seen from above) of the MTJ cell 200 are defined by the intersection of the bit line 137 and the write line 141. As will be apparent from FIGS. 3–5, variations in the line widths of these lines will result in different dimensions for the MTJ cell 200.

An exemplary method for forming the MRAM of FIG. 2A is described as follows. The semiconductor substrate 111 is etched to a predetermined thickness so as to form a circular pillar 112 and to define the planar dimensions for the vertical structure transistor. The gate oxide layer 119 is then grown on the entire surface of substrate 111. An ion implantation of a high concentration N-type impurity is performed on the surface of the substrate 111 and the top portion of the circular pillar 112 to form the source junction region 113 and the drain junction region 117, respectively. Here, the middle portion of the circular pillar 112 forms the channel region 115. The ion implantation process is performed using P or As with an energy of more than 30 KeV at a dose of more than 5E14 ion/cm². The portion of the source junction region 113 under and at the bottom of the channel region 115 is formed by diffusing the impurity through a succession of drive-in steps. The channel region 115 should be greater than 0.5 in height so that the channel of the source/drain junction regions can be formed separately.

A conductor layer for a gate electrode, for example, a polysilicon layer, is deposited on the entire surface and planarized. The polysilicon layer for the gate electrode is photolithography etched, using a gate electrode mask (not shown), to form the gate electrode 121, i.e., a first word line at the sidewall of the circular pillar 112. The gate electrode mask includes a first word line mask that is patterned to define the first word line including the portion surrounding the circular pillar 112, as shown in FIG. 2C.

The gate electrode 121 may be formed by depositing a conductor layer, for example, a polysilicon layer, over the entire surface, then anisotropically etching the polysilicon layer to be in the form of spacer. This technique may be used to form a plurality of first word lines, such as shown in the FIGS. 3–5. The distance between the first word lines may be 1.5 times larger than the distance between circular pillars along a single first word line. In this case, during the anisotropic etching process, the gate electrode is formed by removing a portion the polysilicon layer so that only the first word lines remain and the polysilicon layer between the plurality of first word lines are removed.

Then, a planarized first interlayer insulation layer 123 is formed on the entire surface. A contact hole-through the insulation layer 123—exposes the drain junction region 117. The gate oxide layer 119 is also formed, and a contact line 125 contacting the drain junction region 117 is formed through the contact hole.

Above the contact line 125, a semi-magnetic layer 127, a pinned ferromagnetic layer 129, a tunnel junction layer 131, and a free ferromagnetic layer 133 are sequentially deposited, forming a stacked structure. The stacked structure is then etched and patterned to expose the first interlayer insulation layer 123, through the use of a photolithography process and a MTJ cell mask (not shown). The stacked structure of the non-magnetic layer 127, the pinned ferromagnetic layer 129, the tunnel junction layer 131, and the free ferromagnetic layer 133 is referred to as the MTJ cell 200.

A second interlayer insulation layer 135 is formed on the whole surface and planarized to expose the free ferromagnetic layer 133. A bit line 137 contacting the free ferromagnetic layer 133 is formed. The bit line 137 is designed to have the same width as the MTJ cell 200. A third interlayer insulation layer 139 is formed above the bit line 137 and a write line 141, which functions as a second word line, is patterned on the third interlayer insulation layer 139 over the MTJ cell 200. The write line 141 is perpendicular to the bit line 137, as shown in FIGS. 2C–5 and, in the embodiment of FIG. 2C, has the same width (in plan view) as the MTJ cell 200. The third interlayer insulation layer 139 may be etched during the patterning process of forming the write line 141, though it need not be etched.

Figure 2B:
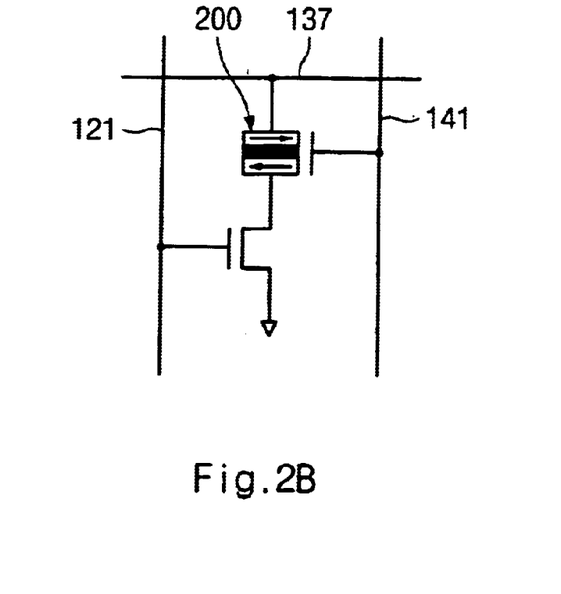
Figure 2C:
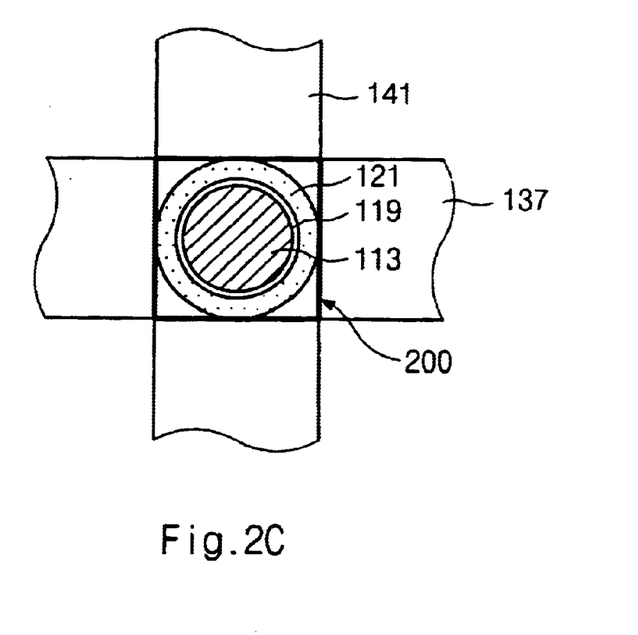

FIG. 2B is a circuit diagram illustrating the MRAM of FIG. 2A, wherein a metal oxide semiconductor field effect transistor (MOSFET) used in the circuit in FIG. 2B has a vertical structure. Like structures with that of FIG. 2A are labeled.

FIG. 2C is a planar top view illustrating a unit cell of the MRAM having a vertical structure transistor, wherein the MTJ cell 200 has a size equal to that of the area of intersection of bit line 137 and write line 141. FIGS. 2C–5 are exemplary in nature and show both the MTJ cell 200 as well as the drain junction region 117, etc. for explanatory purposes. It is clear that some or all of the layers between a top layer in plan view would not be visible. The vertical structure transistor further includes, from center to outer circle, the drain junction region 117, the gate oxide layer 119, and the first word line 121.

Figure 3:
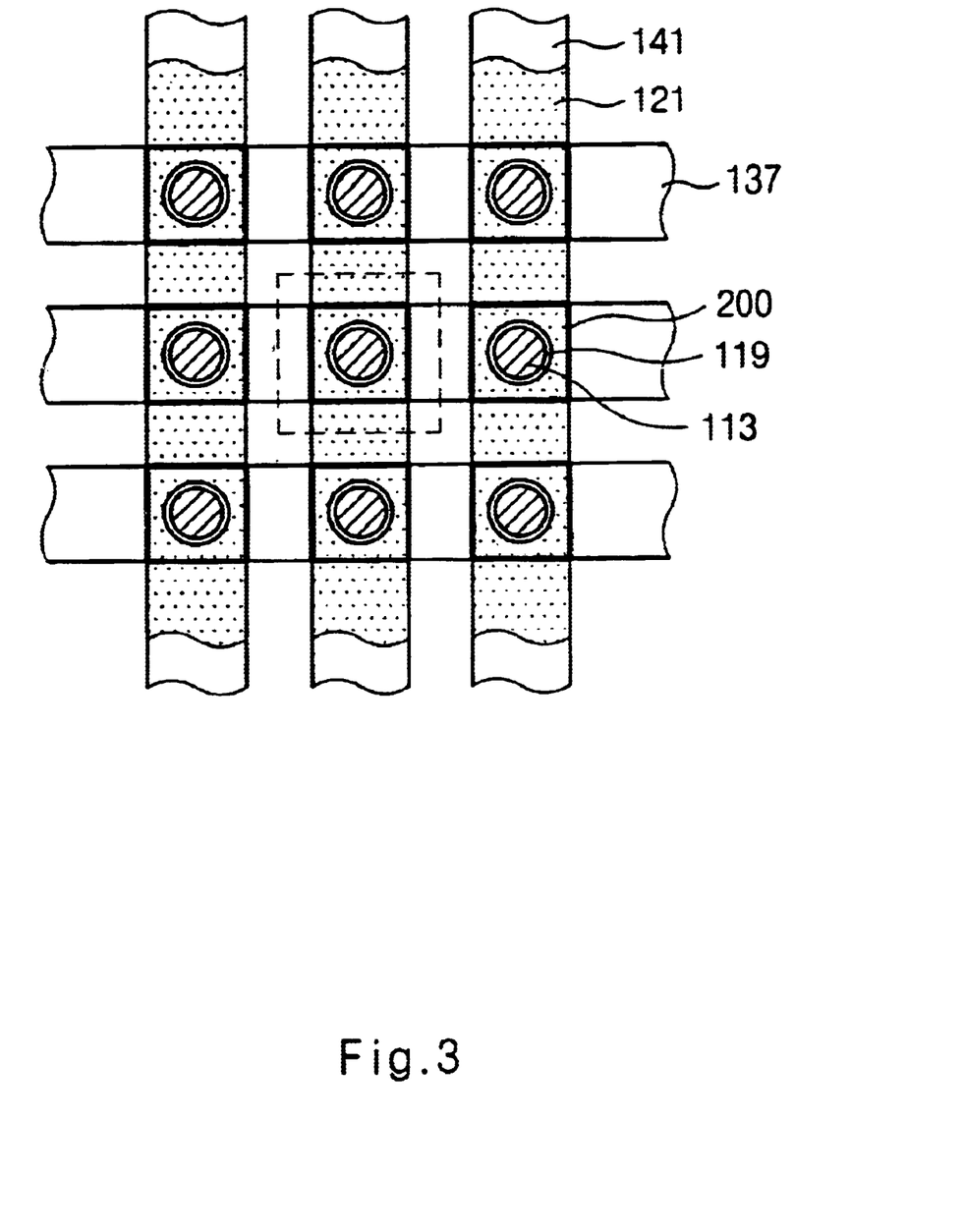
FIG. 3 is a planar top view illustrating the MRAM having a vertical structure transistor.

FIG. 3 is a planar top view illustrating an exemplary embodiment of a plurality of MRAMs each having a vertical structure transistor unit cell similar to that of the MRAM in FIG. 2C. That is, each unit cell includes the first word line 121, the bit line 137, the MTJ cell 200, and the second word line 141. The unit cells are connected together.

In this embodiment, the first word line 121 overlaps the second word line 141, and the bit line 137 is perpendicular to the word lines 121 and 141. Also, the MTJ cell 200 has a size equal to the area of intersection of the bit line 137 and the second word line 141.

The distance between the MTJ cells 200, along either the bit line 137 or the word lines 141 or 121, is set to 1 F, where F denotes an arbitrary unit of minimum line width. The line width of the bit line 137 and the word lines 121 and 141 is set to 1.5 F. The distance between the word lines 121 and the distance between the wordlines 141 and the distance between circular pillars 112 (including the gate oxide region 119) along a word line 141 (or 121) are set to 1 F. The size of the MTJ cell 200 and capacitance of the MRAM are determined by adjusting the line width of the bit line 137 or the word lines 121 and 141, as desired.

Figure 4:
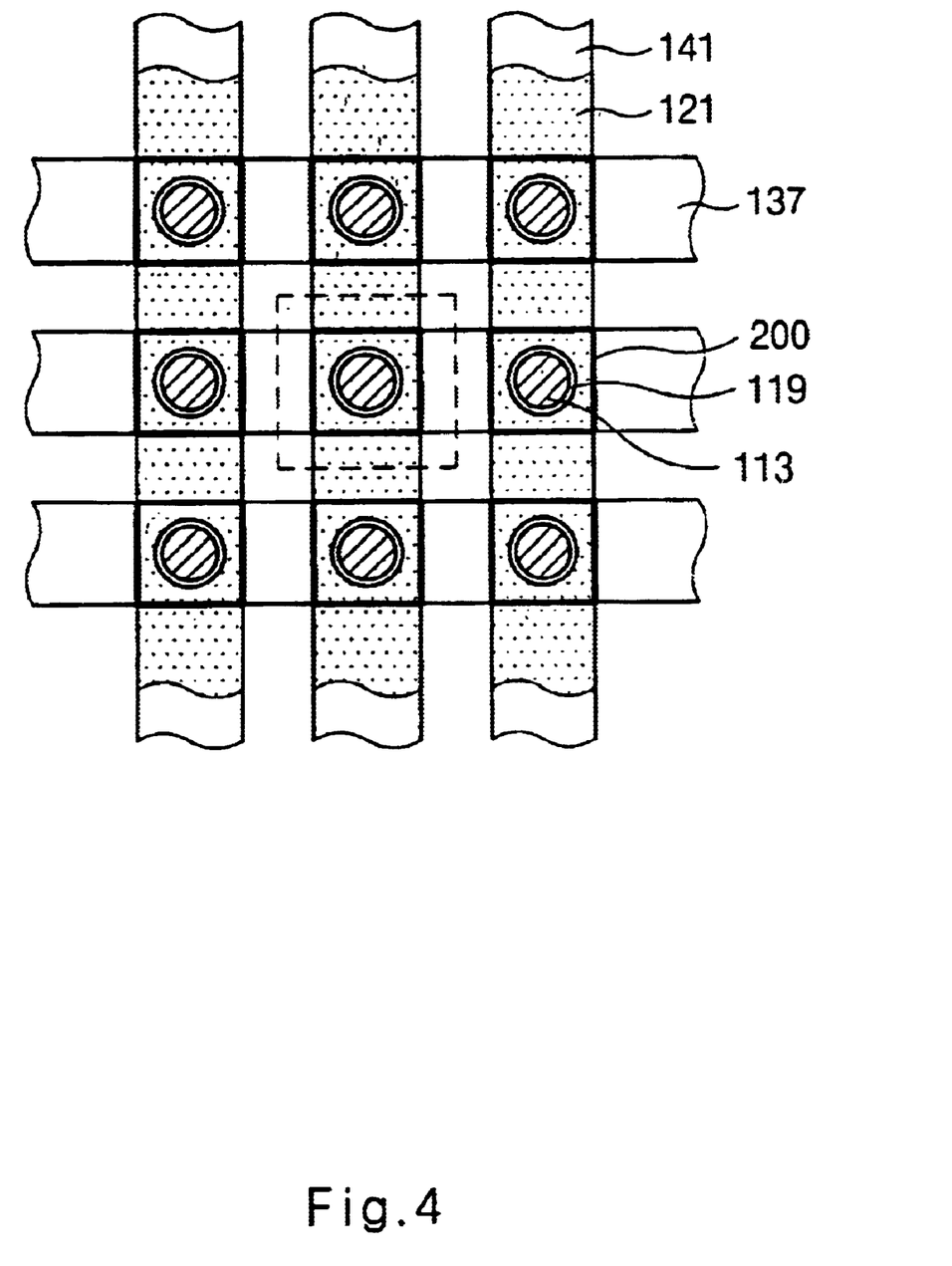
FIG. 4 is a planar top view illustrating the MRAM having a vertical structure transistor.

FIG. 4 is a planar top view illustrating the MRAM having a vertical structure transistor in accordance with a second embodiment. Basically, the word lines and the bit lines are similar to their counterparts in the first embodiment of FIG. 3. However, the bit line 137 in FIG. 4 has the same width as the diameter of the circular pillar 112 (including the gate oxide region 119), and the MTJ cell 200 size, being the area of intersection of the bit line 137 and the write line 141, is smaller than that of FIG. 3.

The distance between the edges of the MTJ cells 200 and the line width of the bit line 137 are set to 1 F. The line width of the word lines 121 and 141 is set to 1.5 F. Additionally, the distance between the word lines 121, the distance between the wordlines 141 and the distance between the circular pillars 112 (including gate oxide regions 119) along each of these word lines are set to 1 F. As with the embodiment of FIG. 3, the size of the MTJ cell 200 and capacitance of the MRAM may be determined by adjusting the line width of the bit line 137 or the word lines 121 and 141, as desired.

Figure 5:
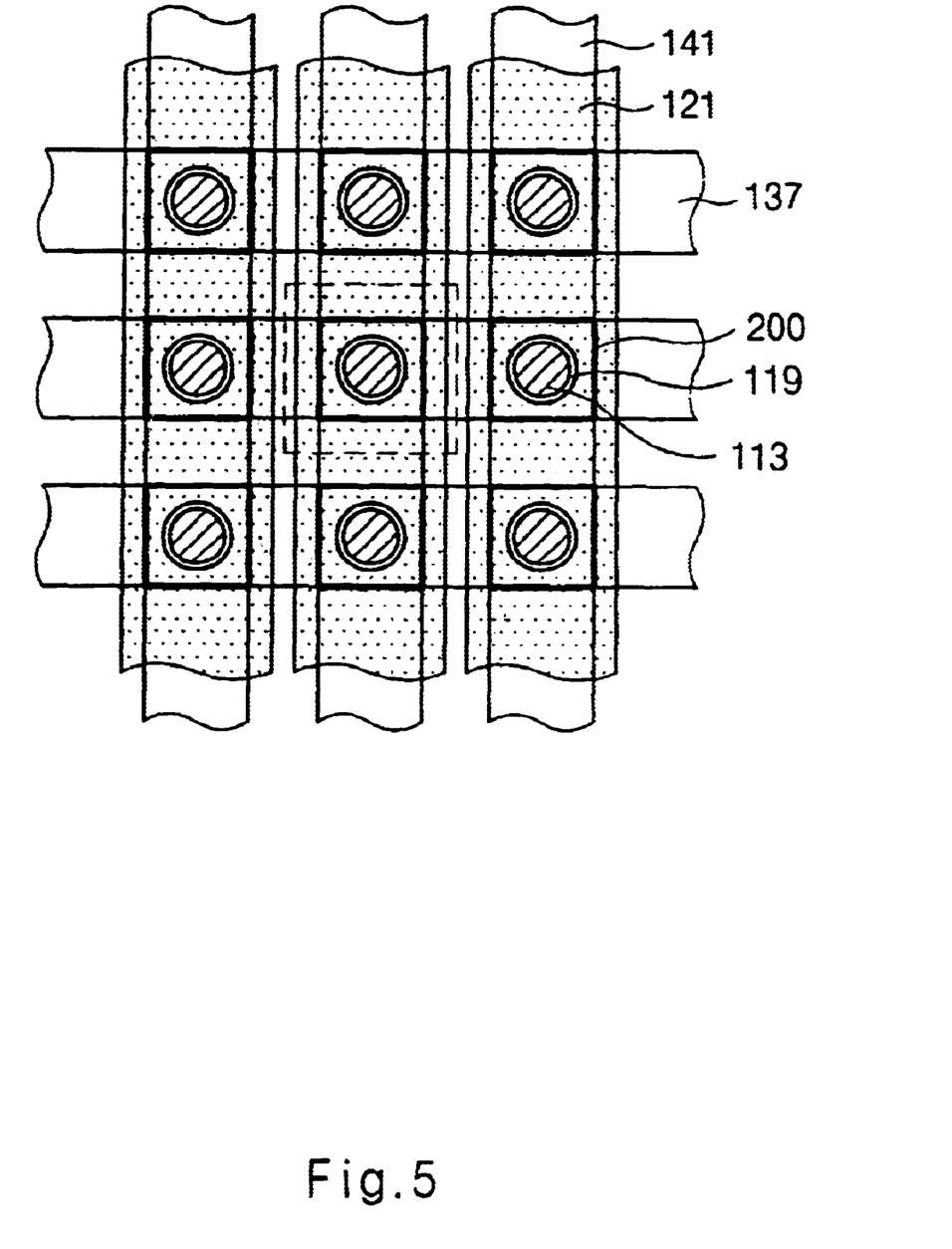
FIG. 5 is a planar top view illustrating the MRAM having a vertical structure transistor.

FIG. 5 is a planar top view illustrating the MRAM having a vertical structure transistor in accordance with a third embodiment. The word lines and the bit lines are similar to their counterparts in the first embodiment of FIG. 3. However, both the bit line 137 and the write line 141 are designed to have a same width as the diameter of the circular pillar 112 (including gate oxide region 119), and the MTJ cell 200 has a size equal to the area of intersection of the bit line 137 and the write line 141. The MTJ cell 200 area is smaller than that of FIGS. 3 and 4.

The distance between the MTJ cells 200 and the line widths of the bit line 137 and the second word line 141 are set to 1 F. The line width of the word lines 121 to 1.5 F. The distance between the word lines 141, i.e., the distance between the circular pillars 112 (including the gate oxide region 119) along the bit line 137, is set to 1 F, and the distance between the circular pillars 112 (including the gate oxide region 119) along the second word line 141 is set to 1 F. By adjusting the line width of the bit line 137 or the second word line 141, the size of the MTJ cell is defined, as well as the capacitance of the MRAM.

For reference, a data storing operation for the MRAM in accordance with the first, second, and third embodiments will now be described. First, a magnetic field created by current flow to write line 141 is used to change a free spin structure of the MTJ cell 200. The current flows to the substrate 111 through the MTJ cell 200, and the first word line 121 goes to high, and thereby the current passed through the MTJ cell 200 leaks to the substrate 111 through the vertical structure transistor. To prevent the leakage current, a voltage or current is applied to the substrate 111 to increase its ground potential. For example, ground voltage Vss or substrate voltage Vbs may be applied to the substrate 111.

As described above, it is possible to simplify manufacturing processes, to improve integration density of semiconductor devices, and to elongate channel length regardless of integration density by using a MRAM having a vertical structure transistor. Therefore, designers can improve the short channel effect and surface roughness control rate on the lower part of a MTJ device by locating the MTJ device on the upper side of the vertical structure transistor. The resistance of the MRAM is more easily controlled, which improves the characteristics and reliability of the devices.

Persons of ordinary skill in the art will appreciate that a MRAM having a vertical structure transistor and the method thereof capable of increasing the short channel effect of the transistor and controlling the resistance of the transistor by forming a MRAM cell using a vertical structure transistor instead of a horizontal structure transistor, by increasing integration density of the cell, and by simplifying the manufacturing process have been provided.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A magnetic random access memory comprising:
    a vertical structure transistor;
    a read line connected to a gate electrode formed at a sidewall of the vertical structure transistor;
    a magnetic tunnel junction cell formed on a drain junction region existing over an upper portion of vertical structure; and
    a write line formed on an upper portion of the magnetic tunnel junction cell, wherein the vertical structure transistor has a circular pillar extending perpendicularly to a semiconductor substrate.

2. The magnetic random access memory of claim 1, further comprising:
    the drain junction region formed in an upper portion of the circular pillar;
    a source junction region formed at a bottom portion of the circular pillar extending into the semiconductor substrate;
    a channel region formed at the center of the circular pillar; and
    a gate insulation layer formed at the sidewall of to circular pillar between the gate electrode and the sidewall of the circular pillar.

3. The magnetic random access memory of claim 1, wherein the read line is parallel to the write line.

4. The magnetic random access memory of claim 1, wherein the magnetic tunnel junction cell has a width equal to a width of any one of the group consisting of the vertical structure transistor, the read line, the write line, the bit line, and the circular pillar.

5. A magnetic random access memory comprising:
    a vertical structure transistor;
    a first word line connected to a gate electrode of the vertical structure transistor;
    a contact line connected to the vertical structure transistor;
    a magnetic tunnel junction cell formed on the contact line;
    a bit line formed on the magnetic tunnel junction cell; and
    a second word line formed on the bit line over an upper portion of the magnetic tunnel junction cell, wherein the vertical structure transistor includes a circular pillar, a gate oxide layer, and a gate electrode, wherein the gate oxide layer is formed at a sidewall of a substrate having a source junction region and a drain junction region.

6. The magnetic random access memory of claim 5, wherein the drain junction region is formed in an upper portion of the circular pillar, and the source junction region is formed at a bottom potion of the circular pillar extending into the substrate surface.

7. The magnetic random access memory of claim 5, wherein the circular pillar is more than 0.5 $\mu$m in height.

8. The magnetic random access memory of claim 5, wherein the magnetic tunnel junction cell is a stacked structure including a semi-magnetic layer, a pinned ferromagnetic layer, a tunnel junction layer, and a free ferromagnetic layer.

9. The magnetic random access memory of claim 5, wherein the magnetic tunnel junction cell has a planar area equal to the area of an intersection of the bit line and the second word line.

10. The magnetic random access memory of claim 5, wherein the bit line is perpendicular to the first word line, and wherein the second word line is perpendicular to the bit line and is parallel to the first word line.

* * * * *

UNITED STATES PATENT AND TRADEMARK OFFICE
CERTIFICATE OF CORRECTION

PATENT NO. : 6,649,953 B2  Page 1 of 1
DATED : November 18, 2003
INVENTOR(S) : Seon Y. Cha It is certified that error appears in the above-identified patent and that said Letters Patent is hereby corrected as shown below:

<u>Title page, Item [54] and Column 1, line 2,</u>
Title, please delete "HAVING A TRANSISTOR" and replace with -- HAVING TRANSISTOR --.

<u>Title page,</u>
Item [73], Assignee, please delete "Inc," and replace with -- Inc. --.

<u>Column 8,</u>
Line 19, please delete "of the circular' and replace with -- of the circular --.

Signed and Sealed this

Eleventh Day of May, 2004

JON W. DUDAS
*Acting Director of the United States Patent and Trademark Office*